US008878171B2

(12) United States Patent
Heo et al.

(10) Patent No.: US 8,878,171 B2
(45) Date of Patent: Nov. 4, 2014

(54) ORGANIC LIGHT EMITTING DISPLAY DEVICE

(71) Applicant: LG Display Co., Ltd., Seoul (KR)

(72) Inventors: Jeong-Haeng Heo, Gyeonggi-do (KR); Jae-Man Lee, Seoul (KR); Gwi-Jeong Cho, Daegu (KR); So-Yeon Ahn, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/036,163

(22) Filed: Sep. 25, 2013

(65) Prior Publication Data

US 2014/0091289 A1    Apr. 3, 2014

(30) Foreign Application Priority Data

Sep. 28, 2012  (KR) ........................ 10-2012-0109027

(51) Int. Cl.
*H01L 51/50*    (2006.01)

(52) U.S. Cl.
CPC ........ *H01L 51/5064* (2013.01); *H01L 51/5072* (2013.01)
USPC .................................... 257/40; 257/E51.022

(58) Field of Classification Search
USPC .................................. 257/E51.019, E51.022
See application file for complete search history.

(56) References Cited

U.S. PATENT DOCUMENTS

| 7,994,498 | B2 * | 8/2011 | Pieh et al. | 257/40 |
|---|---|---|---|---|
| 8,294,143 | B2 * | 10/2012 | Imai et al. | 257/40 |
| 2009/0315024 | A1 | 12/2009 | Song et al. | |
| 2010/0133522 | A1 | 6/2010 | Pieh et al. | |
| 2013/0092909 | A1 | 4/2013 | Han et al. | |

OTHER PUBLICATIONS

Combined Search and Examination Report dated Feb. 21, 2014 from the Intellectual Property Report from the United Kingdom Intellectual Property Office in counterpart application No. GB 1316848.9.

* cited by examiner

*Primary Examiner* — Chandra Chaudhari
(74) *Attorney, Agent, or Firm* — Morgan, Lewis & Bockius LLP (57) ABSTRACT

An organic light emitting display device includes first and second electrodes facing each other on a substrate, a first stack including a first hole transport layer, a second hole transport layer, a first emitting layer, and a first electron transport layer, the layers being sequentially stacked on the first electrode, a second stack including a third hole transport layer, a fourth hole transport layer, a second emitting layer including at least two hosts and a single dopant and having at least three emitting areas, and a second electron transport layer, the layers being sequentially stacked between the first stack and the second electrode, wherein the second emitting layer includes a first emitting area including a material of the fourth hole transport layer, a second emitting area including a material of the second electron transport layer, and a third emitting area including the at least two hosts.

15 Claims, 11 Drawing Sheets

ORGANIC LIGHT EMITTING DISPLAY DEVICE

This application claims the benefit of Korean Patent Application No. 10-2012-0109027, filed on Sep. 28, 2012, which is hereby incorporated by reference as if fully set forth herein.

BACKGROUND OF THE INVENTION

1. Field of the Invention

The present invention relates to an organic light emitting display device, and more particularly, to an organic light emitting display device with improved lifespan by reducing resistance at an interface between an emitting layer and a hole transport layer or an electron transport layer that is formed adjacent thereto.

2. Discussion of the Related Art

Image display devices, which display a variety of information on a screen, are a core technology of information and communication and are becoming increasingly thinner, lighter, more portable, and higher in performance. Thus, organic light emitting device (OLED) display devices, which display an image by controlling light emission of an organic emitting layer (EML), have received attention as a flat panel display device that may address problems in terms of weight and volume which occur in cathode ray tubes (CRTs).

OLEDs are self-emissive devices including a thin EML between electrodes and can be fabricated as a thin film with a thickness similar to that of paper. In particular, an OLED includes an anode, a hole transport layer (HTL), a hole injection layer (HIL), an EML, an electron injection layer (EIL), an electron transport layer (ETL), and a cathode.

As such, an EML is formed between an HTL and an ETL. In this regard, it is difficult for holes to move towards the EML due to an interface barrier between the HTL and the EML and it is difficult for electrons to move towards the EML due to an interface barrier between the ETL and the EML. Accordingly, lifespan of an OLED is reduced.

SUMMARY OF THE INVENTION

Accordingly, the present invention is directed to an organic light emitting display device that substantially obviates one or more problems due to limitations and disadvantages of the related art.

An object of the present invention is to provide an organic light emitting display device with improved lifespan by reducing resistance at an interface between an emitting layer and a hole transport layer or an electron transport layer that is formed adjacent thereto.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an organic light emitting display device includes first and second electrodes facing each other on a substrate, a first stack including a hole injection layer, a first hole transport layer, a second hole transport layer, a first emitting layer, and a first electron transport layer, the layers being sequentially stacked on the first electrode, a second stack including a third hole transport layer, a fourth hole transport layer, a second emitting layer including at least two hosts and a single dopant and having at least three emitting areas, and a second electron transport layer, the layers being sequentially stacked between the first stack and the second electrode, and a charge generation layer formed between the first stack and the second stack and adjusting charge balance between the first and second stacks, wherein the second emitting layer includes a first emitting area including a material of the fourth hole transport layer, a second emitting area including a material of the second electron transport layer, and a third emitting area including the at least two hosts.

The third emitting area may include first and second hosts and a phosphorescent dopant.

The first emitting area may include the first host and a phosphorescent dopant, the phosphorescent dopant being the same as that of the third emitting area.

The second emitting area may include the second host and the phosphorescent dopant, the phosphorescent dopant being the same as that of the third emitting area.

The first host may include a material that more satisfactorily receives holes transferred from the fourth hole transport layer than the second host.

The second host may include a material that more satisfactorily receives electrons transferred from the second electron transport layer than the first host.

The first emitting area may have a thickness of 30 Å to 100 Å, and the second emitting area may have a thickness of 30 Å to 100 Å.

The second emitting layer may have a thickness of 150 Å to 250 Å.

In another aspect of the present invention, an organic light emitting display device includes first and second electrodes facing each other on a substrate, a first stack including a hole injection layer, a first hole transport layer, a second hole transport layer, a first emitting layer, and a first electron transport layer, the layers being sequentially stacked on the first electrode, a second stack including a third hole transport layer, a fourth hole transport layer, a second emitting layer including at least two hosts and a dopant, and a second electron transport layer, the layers being sequentially stacked between the first stack and the second electrode, a charge generation layer formed between the first stack and the second stack and adjusting charge balance between the first and second stacks, and at least one of a first mixing layer disposed between the fourth hole transport layer and the second emitting layer and including a material of the fourth hole transport layer and the dopant and a second mixing layer disposed between the second electron transport layer and the second emitting layer and including a material of the second electron transport layer and the dopant.

The second emitting layer may include first and second hosts and a phosphorescent dopant.

The first host may include a material that more satisfactorily receives holes transferred from the first mixing layer including the material of the fourth hole transport layer than the second host.

The second host may include a material that more satisfactorily receives electrons transferred from the second mixing layer including the material of the second electron transport layer than the first host.

The dopant of the first and second mixing layers may be the same as that of the second emitting layer.

The first mixing layer may have a thickness of 30 Å to 100 Å, and the second mixing layer may have a thickness of 30 Å to 100 Å.

The second emitting layer may have a thickness of 150 Å to 250 Å.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Hereinafter, embodiments will be described with reference to the annexed drawings. Features and operating effects of the embodiments will be clearly understood from the following description of specific embodiments. The same reference numerals will be used throughout the drawings to refer to the same elements. When a detailed description of the related art may unnecessarily obscure the subject matter of the present invention, a description thereof will be omitted.

Hereinafter, exemplary embodiments of the present invention will be described in detail with reference to FIGS. 1A through 6B.

Figure 1A:
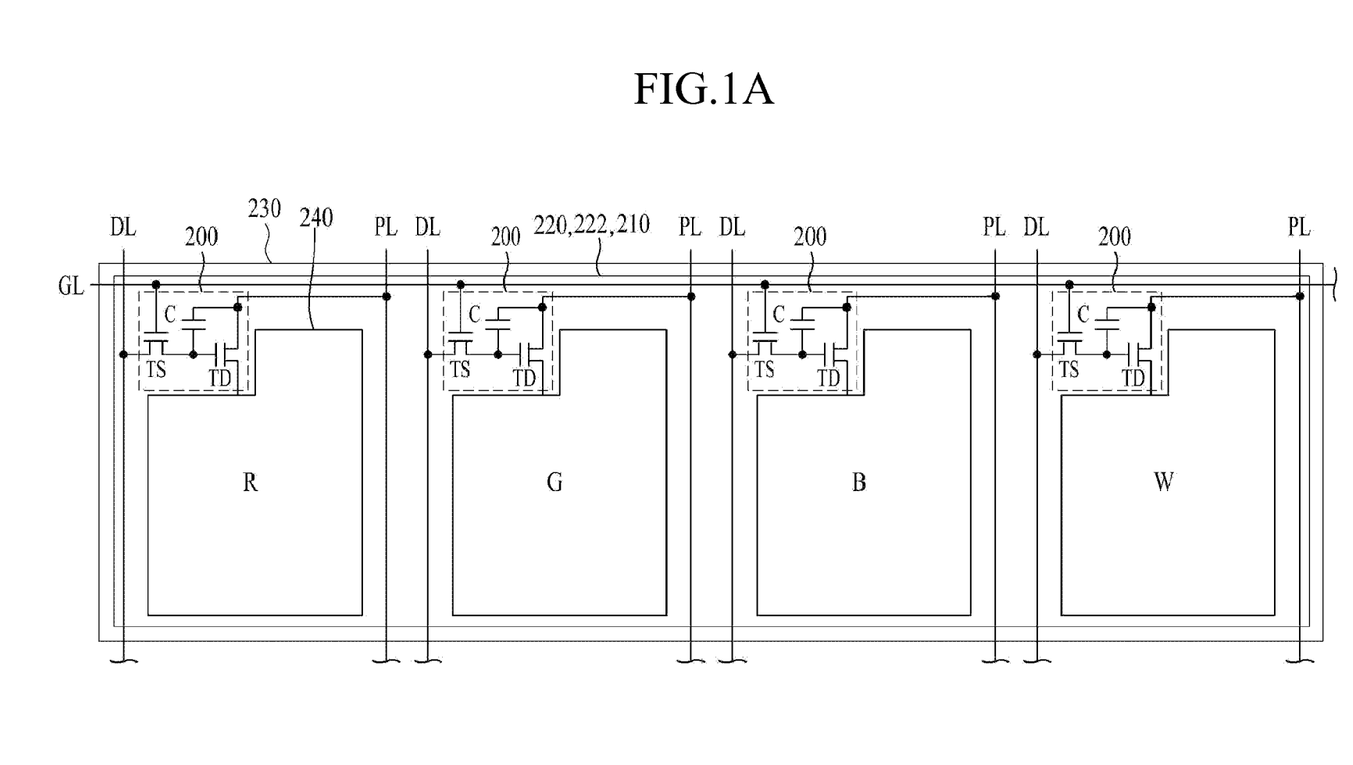
FIGS. 1A through 1D are equivalent circuit diagrams each illustrating R, G, B and W pixels of an organic light emitting display device according to a first embodiment of the present invention.
Figure 1B:
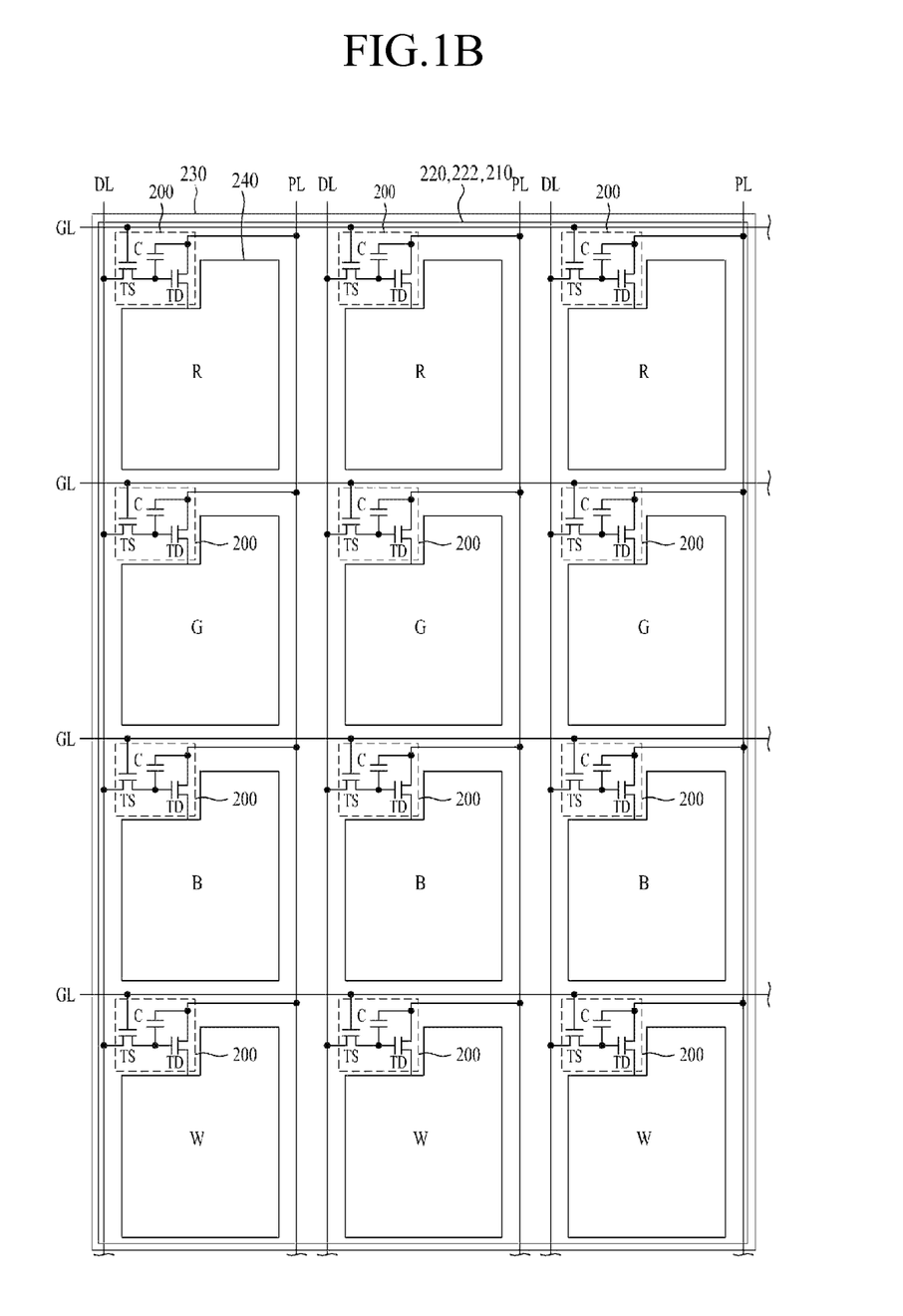
Figure 2:
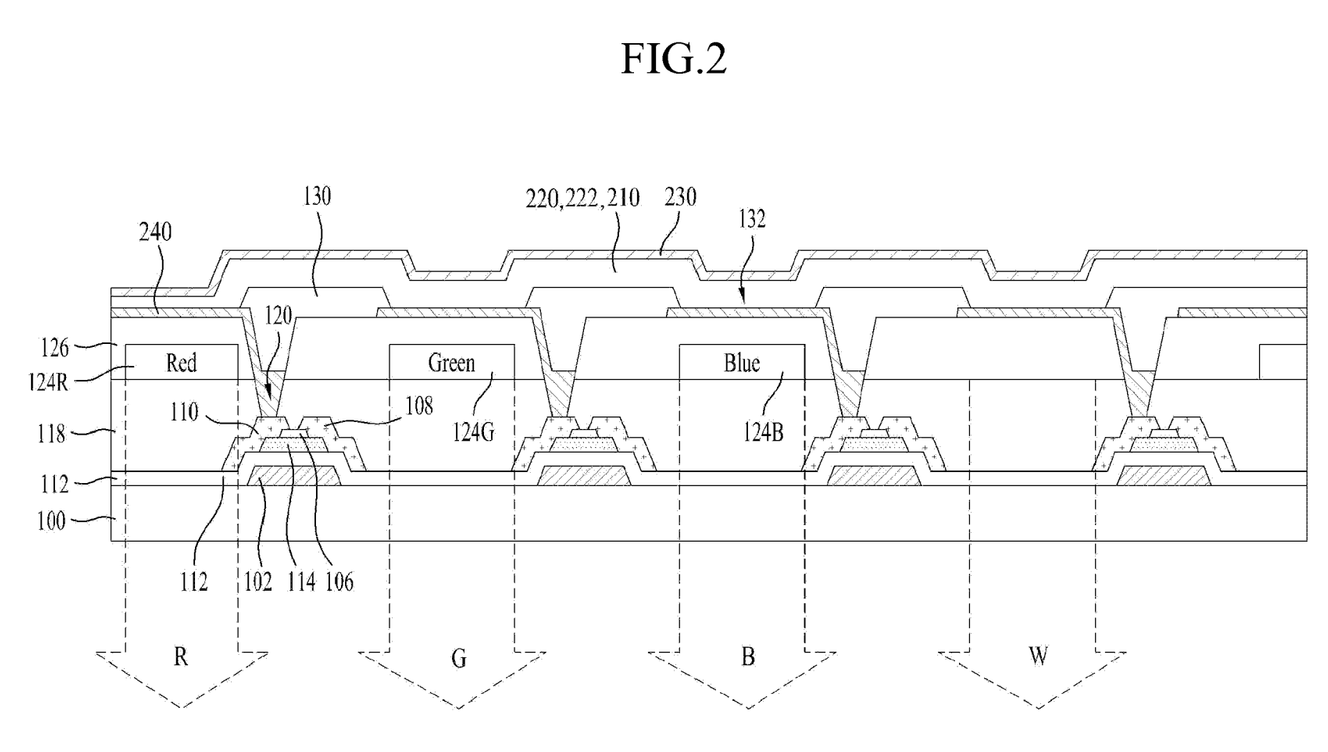
FIG. 2 is a sectional view of the organic light emitting display device according to R, G, B and W sub-pixel regions illustrated in FIGS. 1A to 1D.
Figure 3:
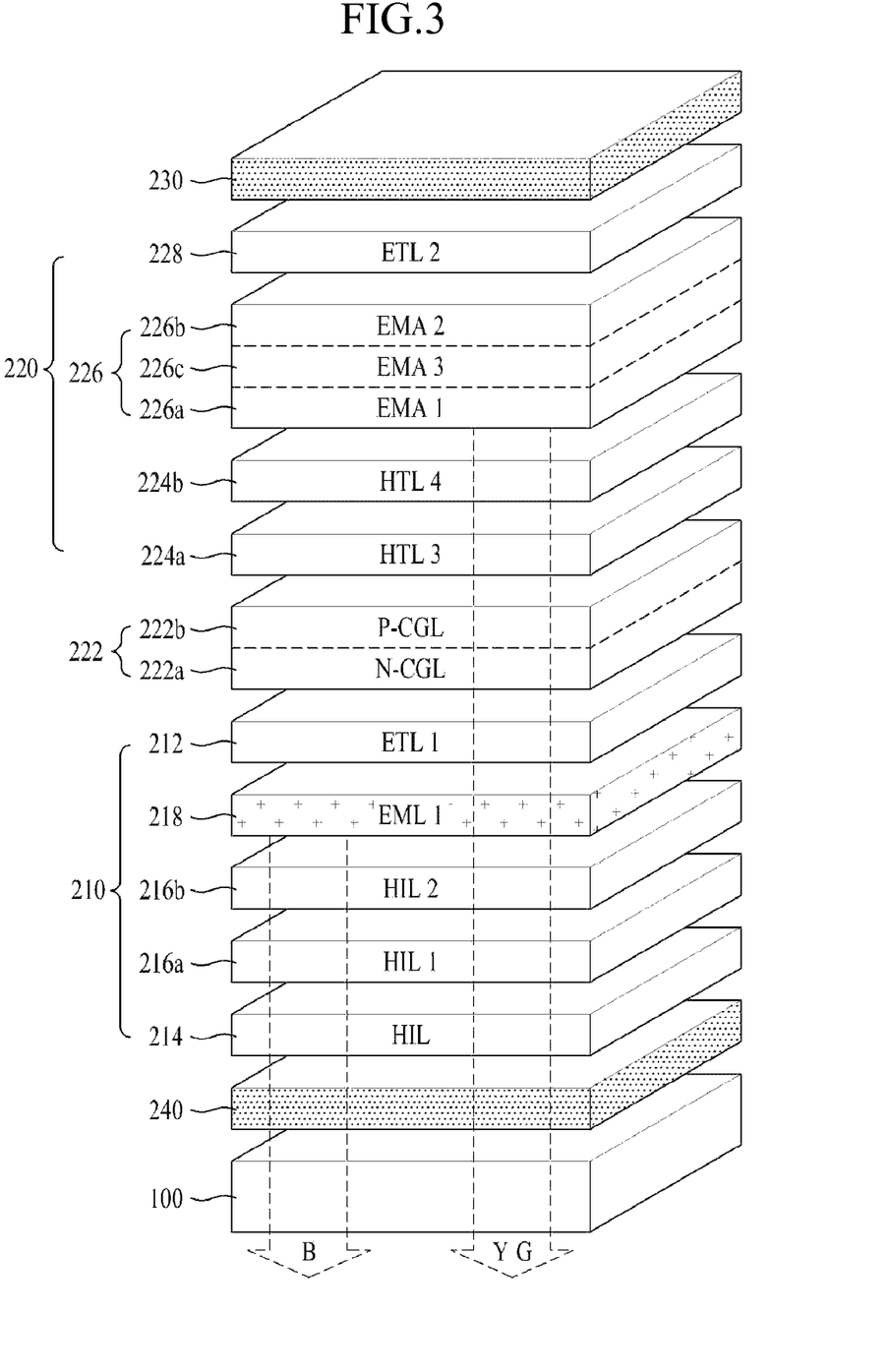
FIG. 3 is a perspective view of a white organic light emitting diode (OLED) of the organic light emitting display device according to the first embodiment of the present invention.
Figure 4A:
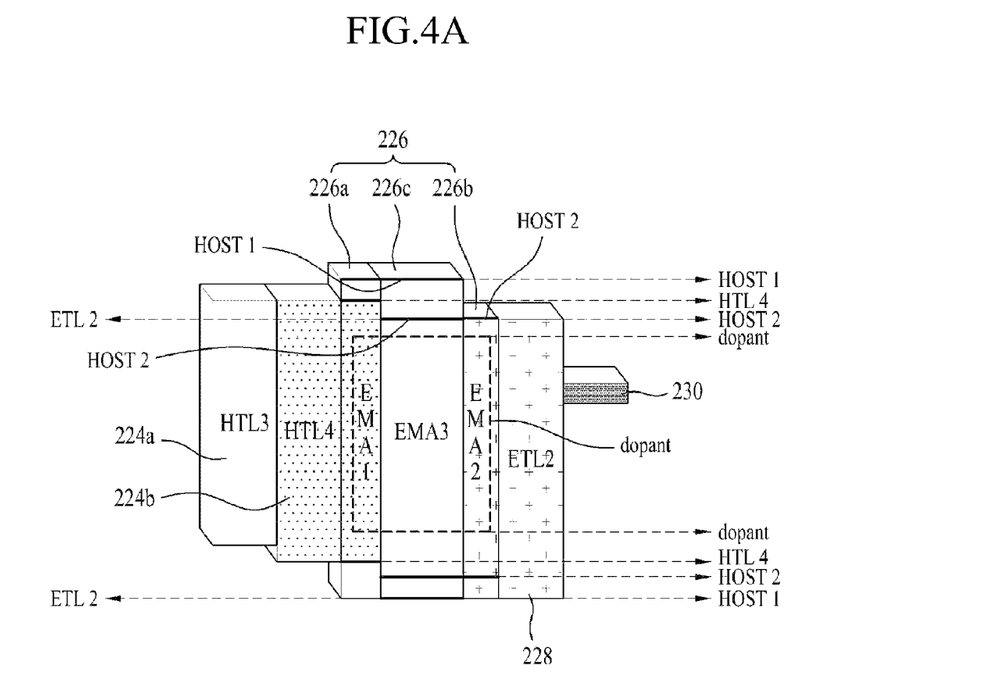
FIG. 4A is a band diagram illustrating the white OLED illustrated in FIG. 3.
Figure 4B:
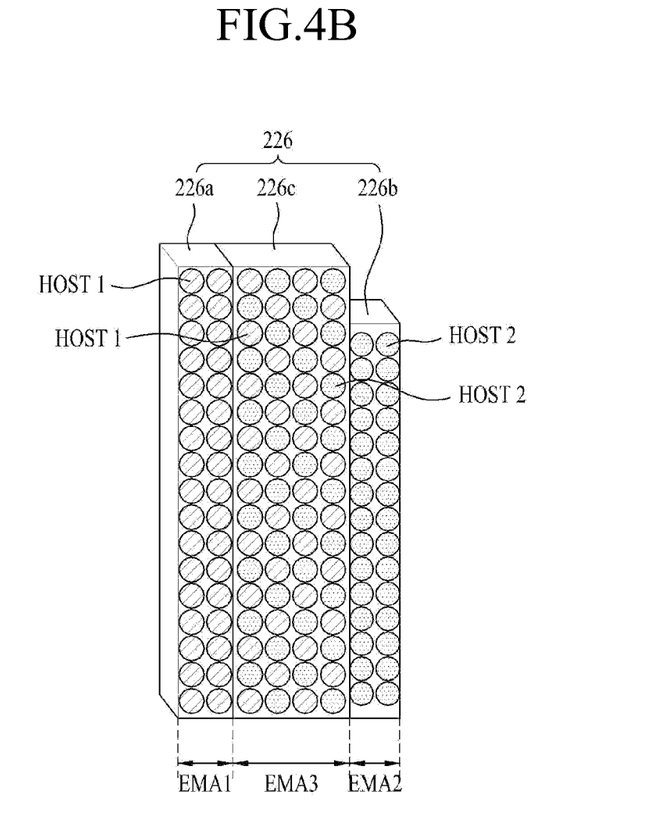
FIG. 4B is a view illustrating first and second hosts formed in first, second and third emitting areas illustrated in FIG. 3.

FIGS. 1A through 1D are equivalent circuit diagrams each illustrating R, G, B and W pixels of an organic light emitting display device according to a first embodiment of the present invention. FIG. 2 is a sectional view of the organic light emitting display device according to R, G, B and W sub-pixel regions illustrated in FIGS. 1A to 1D. FIG. 3 is a perspective view of a white organic light emitting diode (OLED) of the organic light emitting display device according to the first embodiment of the present invention. FIG. 4A is a band diagram illustrating the white OLED illustrated in FIG. 3. FIG. 4B is a view illustrating first and second hosts formed in first, second and third emitting areas illustrated in FIG. 3.

The organic light emitting display device according to the present invention includes a substrate in which a display region is defined by a plurality of sub-pixel regions in the form of a matrix and an encapsulation substrate or a thin-film encapsulation that is formed on the substrate and protects sub-pixels from moisture or oxygen.

The sub-pixel regions consist of an R sub-pixel region, a G sub-pixel region, a B sub-pixel region, and a W sub-pixel region, and the R, G, B and W sub-pixel regions are arranged in a matrix form and display an image. As illustrated in FIG. 1A, the sub-pixel regions may be configured such that the R, G, B and W sub-pixel regions are arranged in a single row parallel to a gate line, such as in an array of 1 row and 4 columns (1 row×4 columns). In another embodiment, as illustrated in FIG. 1B, the R, G, B and W sub-pixel regions may be arranged in a single column parallel to a data line, such as in an array of 4 rows and 1 column (4 rows×1 column). Although a case in which the R, G, B and W sub-pixel regions are arranged in this order has been described, R, B, G and W sub-pixel regions may be arranged in this order or W, R, G and B sub-pixel regions may be arranged in this order. That is, disposition order is not limited to the above-described examples and may be changed as desired by a user.

Figure 1C:
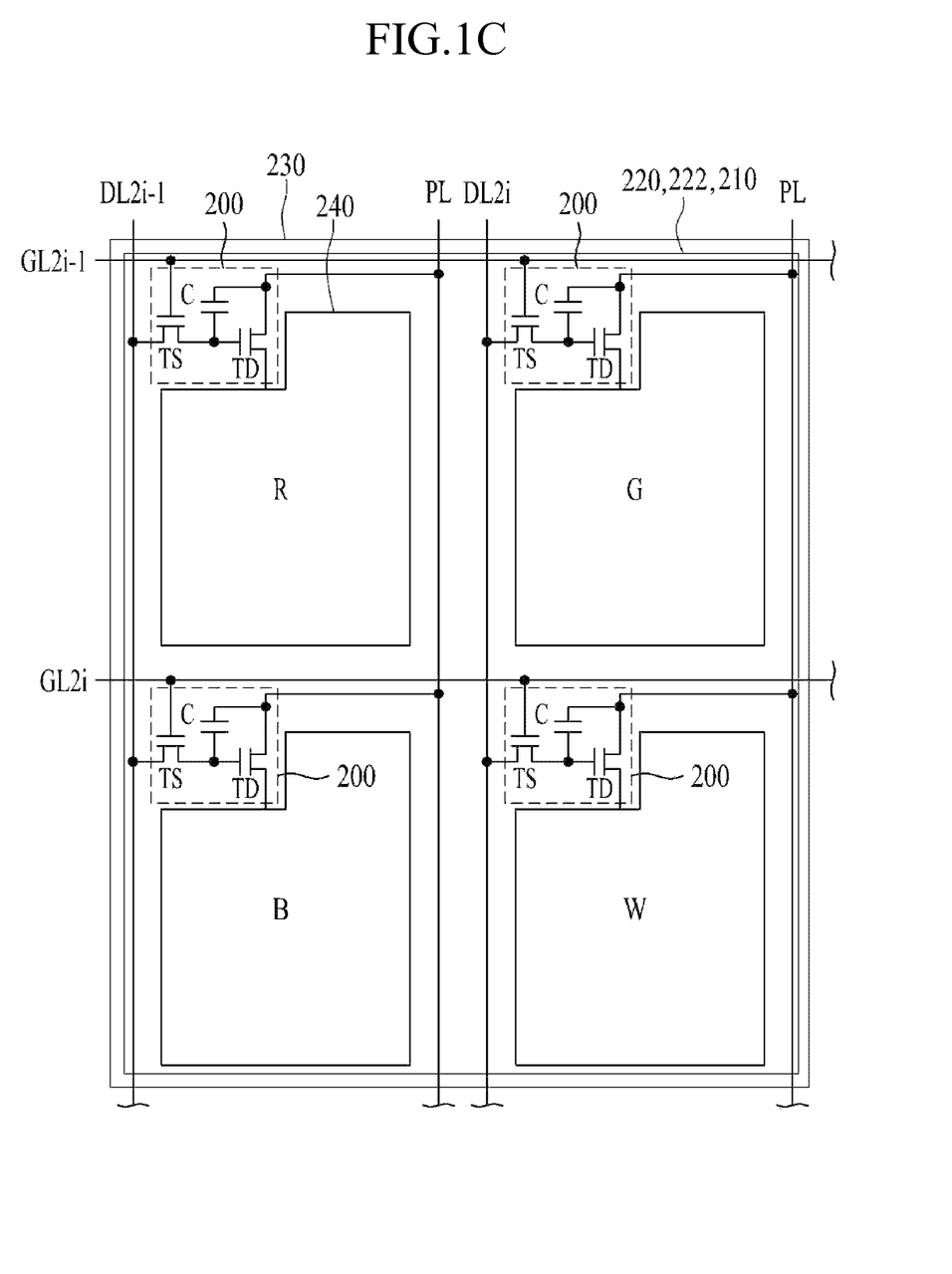
Figure 1D:
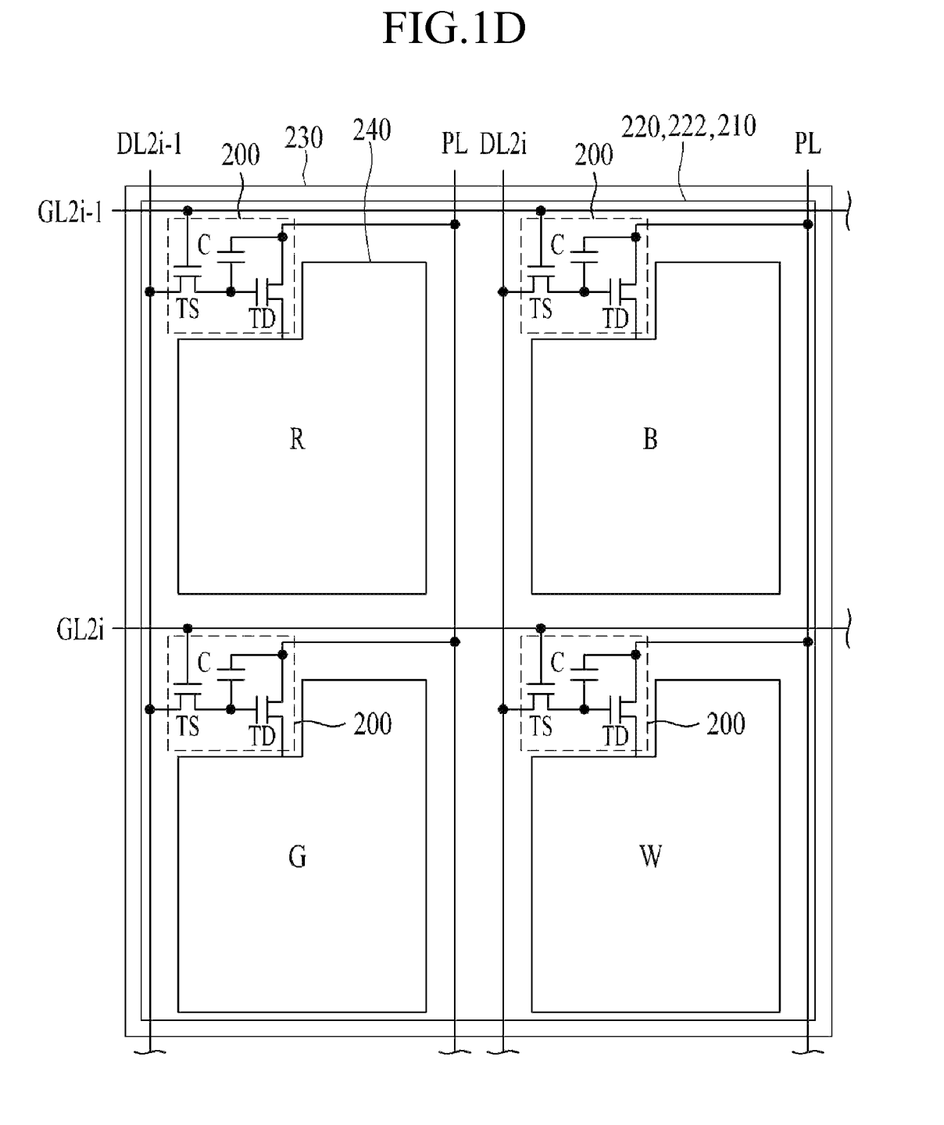

In addition, as illustrated in FIGS. 1C and 1D, the R, B, G and W sub-pixel regions may be arranged in an array of 2 rows×2 columns. For example, as illustrated in FIG. 1C, the R sub-pixel region may be formed at an intersection between a $2i-1^{th}$ (here, i is a natural number of 1 or more) data line (DL2i−1) and a $2i-1^{th}$ gate line (GL2i−1), the G sub-pixel region may be formed at an intersection between a $2i^{th}$ data line (DL2i) and the $2i-1^{th}$ gate line (GL2i−1), the B sub-pixel region may be formed at an intersection between the $2i-1^{th}$ data line (DL2i−1) and a $2i^{th}$ gate line (GL2i), and the W sub-pixel region may be formed at an intersection between the $2i^{th}$ dataline (DL2i) and the $2i^{th}$ gate line (GL2i).

In addition, as illustrated in FIG. 1D, the R sub-pixel region may be formed at an intersection between the $2i-1^{th}$ data line (DL2i−1) and the $2i-1^{th}$ gate line (GL2i−1), the B sub-pixel region may be formed at an intersection between the $2i^{th}$ data line (DL2i) and the $2i-1^{th}$ gate line (GL2i−1), the G sub-pixel region may be formed at an intersection between the $2i-1^{th}$ data line (DL2i−1) and the $2i^{th}$ gate line (GL2i), and the W sub-pixel region may be formed at an intersection between the $2i^{th}$ data line (DL2i) and the $2i^{th}$ gate line (GL2i).

Each of the R, G, B and W sub-pixel regions includes a cell driving unit 200 and a white OLED connected to the cell driving unit 200.

The cell driving unit 200 includes a switch thin film transistor TS connected to a gate line GL and a data line DL, a driving thin film transistor TD connected to the switch thin film transistor TS, a power line PL, and a first electrode 240 of the white OLED, and a storage capacitor C connected to the power line PL and a drain electrode 110 of the switch thin film transistor TS. Each sub-pixel region may have a structure including a switch transistor, a driving transistor, a capacitor, and an OLED or may have a structure further including a transistor and a capacitor. In addition, the driving thin film transistor TD may be directly connected to the first electrode 240 of the white OLED and, in another embodiment, another thin film transistor may be formed between the driving thin film transistor TD and the white OLED.

A gate electrode of the switch thin film transistor TS is connected to the gate line GL, a source electrode thereof is connected to the data line DL, and a drain electrode thereof is connected to a gate electrode of the driving thin film transistor TD and the storage capacitor C. A source electrode of the driving thin film transistor TD is connected to the power line PL and a drain electrode 110 thereof is connected to the first electrode 240. The storage capacitor C is connected between the power line PL and the gate electrode of the driving thin film transistor TD.

The switch thin film transistor TS is turned on when a scan pulse is supplied to the gate line GL and thus a data signal supplied to the data line DL is supplied to the storage capacitor C and the gate electrode of the driving thin film transistor TD. The driving thin film transistor TD controls current I supplied from the power line PL to the OLED in response to the data signal supplied to the gate electrode, thereby adjusting light emission of the OLED. In addition, even through the switch thin film transistor TS is turned off, the driving thin film transistor TD supplies constant current I until a data signal of the next frame is supplied, due to voltage charged in the storage capacitor C, whereby the white OLED maintains light emission.

As illustrated in FIG. 2, the driving thin film transistor TD is connected to the gate line GL and includes a gate electrode 102 formed on a substrate 100, a gate insulating film 112 formed on the gate electrode 102, an oxide semiconductor layer 114 formed to correspond to the gate electrode 102, with the gate insulating film 112 disposed therebetween, an etch stopper 106 formed on the oxide semiconductor layer 114 to prevent damage to the oxide semiconductor layer 114 and protect the oxide semiconductor layer 114 from oxygen, a source electrode 108 connected to the data line DL, and the drain electrode 110 facing the source electrode 108. In addition, a first passivation film 118 is formed on the driving thin film transistor TD.

The oxide semiconductor layer 114 is formed of an oxide including at least one metal selected from among Zn, Cd, Ga, In, Sn, Hf, and Zr. A thin film transistor including such oxide semiconductor layer has higher charge mobility and lower leakage current than a thin film transistor including a silicon semiconductor layer. In addition, the thin film transistor including a silicon semiconductor layer is manufactured through a high-temperature manufacturing process and needs to be subjected to a crystallization process, and thus, as the thin film transistor is fabricated to a large area, uniformity is deteriorated during the manufacturing process, which makes it difficult to fabricate a large-area thin film transistor. By contrast, the thin film transistor including the oxide semiconductor layer 114 may be manufactured through a low-temperature manufacturing process and is advantageously suited to large-area fabrication.

As a color filter, an R color filter 124R is formed on a passivation film of the R sub-pixel region to realize a red (R) color, a G color filter 124G is formed on a passivation film of the G sub-pixel region to realize a green (G) color, a B color filter 124B is formed on a passivation film of the B sub-pixel region to realize a blue (B) color, and no color filter is formed on a passivation film of the W sub-pixel region and thus the W sub-pixel region realizes a white (W) color. In addition, a second passivation film 126 is formed on the R, G and B color filters 124R, 124G and 124B.

With reference to FIGS. 2 and 3, the white OLED has a multi-stack structure including the first electrode 240 connected to the drain electrode 110 of the driving thin film transistor TD, a second electrode 230 facing the first electrode 240, a bank insulating film 130 provided with bank holes 132 to expose the first electrode 240, and a first stack 210, a charge generation layer (CGL) 222, and a second stack 220 that are stacked between the first electrode 240 and the second electrode 230. In the white OLED having a multi-stack structure, the respective stacks includes EMLs of different colors, and light emitted from the EMLs of the respective stacks is mixed to realize white light. In addition, FIG. 3 illustrates a bottom emission type white OLED in which light emitted from first and second EMLs 218 and 226 is emitted in a bottom direction, but embodiments of the present invention are not limited thereto. In another embodiment, the white OLED according to the first embodiment of the present invention may be of a top emission type or a dual emission type.

The first electrode 240 as an anode is formed of a transparent conductive material such as a transparent conductive oxide (TCO), e.g., indium tin oxide (ITO), indium zinc oxide (IZO), or the like.

The second electrode 230 as a cathode is formed of a reflective metal material such as aluminum (Al), gold (Au), molybdenum (Mo), chromium (Cr), copper (Cu), LiF, an Al-LiF alloy, or the like.

The first stack 210 includes a hole injection layer (HIL) 214, a first hole transport layer (HTL1) 216a, an HTL2 216b, a first emitting layer (EML1) 218, and a first electron transport layer (ETL1) 212 that are sequentially stacked between the first electrode 240 and the CGL 222. In this regard, the EML1 218 includes a fluorescent blue dopant and host to emit blue light.

The CGL 222 is formed between the first and second stacks 210 and 220 to adjust charge balance therebetween. The CGL 222 includes an N-type CGL (N-CGL) 222a formed adjacent to the first stack 210 to inject electrons into the first stack 210 and a P-type CGL (P-CGL) 222b disposed adjacent to the second stack 220 to inject holes into the second stack 220.

The second stack 220 includes a third HTL (HTL3) 224a, a fourth HTL (HTL4) 224b, a second emitting layer 226, and a second ETL (ELT2) 228 that are sequentially stacked between the second electrode 230 and the CGL 222.

The HTL3 224a transfers holes supplied from the P-CGL 222b to the HTL4 224b, is the thickest element of the white OLED, and adjust cavity balance. The HTL4 224b transfers holes supplied from the HTL3 224a to the EML2 226 and has a higher triplet energy level T1 than that of the EML2 226 so as to prevent holes injected into the EML2 226 from returning into the HTL4 224b.

The EML2 226 consists of at least two hosts and a single dopant and has at least three emitting areas. Preferably, the EML2 226 consists of different host materials, i.e., first and second hosts (HOST1 and HOST2) and a phosphorescent yellow-green dopant.

In particular, the EML2 226 includes a first emitting area (EMA1) 226a including a material for forming the HTL4 224b, a second emitting area (EMA2) 226b including a material for forming the ETL2 228, and a third emitting area (EMA3) 226c including the first and second hosts (HOST1 and HOST2). In this regard, a total thickness of the EML2 226 is 150 Å to 250 Å.

As illustrated in FIGS. 4A and 4B, the EMA1 226a is formed of the material of the HTL4 224b, the HOST1, and the phosphorescent yellow-green dopant. As such, the EMA1 226a includes the material of the HTL4 224b and thus reduces interface resistance between the EML2 226 and the HTL4 224b and facilitates injection of holes into the EMA3 226c by the EML2 226. In addition, the HOST1 is formed of a material that more satisfactorily receives holes transferred from the HTL4 224b than the HOST2. Thus, the EMA1 226a satisfactorily receives holes transferred from the HTL4 224b via the HOST1 and, accordingly, electrons and holes are smoothly recombined without disappearance or accumulation of charges, which results in enhanced luminous efficiency. In this regard, the EMA1 226a has a thickness of 30 Å to 100 Å.

As illustrated in FIGS. 4A and 4B, the EMA2 226b includes the material of the ETL2 228, the HOST2, and the phosphorescent yellow-green dopant in combination. As such, the EMA2 226b includes the material of the ETL2 228 and thus reduces interface resistance between the EML2 226 and the ETL2 228 and facilitates injection of electrons into the EMA3 226c by the EML2 226. In addition, the HOST2 is formed of a material that more satisfactorily receives electrons transferred from the ETL2 228 than the HOST1. Thus, the EMA2 226b satisfactorily receives electrons transferred from the ETL2 228 via the HOST2 and, accordingly, electrons and holes are smoothly recombined without disappearance or accumulation of charges, which results in enhanced luminous efficiency. In this regard, the EMA2 226b has a thickness of 30 Å to 100 Å.

As illustrated in FIGS. 4A and 4B, the EMA3 226c includes the HOST1 and HOST2 and the phosphorescent yellow-green dopant in combination. The EMA3 226c satisfactorily receives holes from the material of the HTL4 224b included in the EMA1 226a and satisfactorily receives electrons from the material of the ETL2 228 included in the EMA2 226b and, accordingly, luminous efficiency is enhanced. The EMA1 226a, the EMA2 226b, and the EMA3 226c are formed of the same dopant.

As such, the charge barrier between the HTL4 224b and the EML2 226 is reduced through the EMA1 226a, and the charge barrier between the ETL2 228 and the EML2 226 is reduced through the EMA2 226b. As the charge barrier decreases, charge accumulation is reduced and thus the white OLED is not deteriorated, which results in improved lifespan of the white OLED. This will be described with reference to Table 1 below.

Table 1 shows lifespan (in hours) of a white OLED according to a comparative embodiment and lifespan (in hours) of the white OLED according to the first embodiment of the present invention.

TABLE 1

| Structure | 10 mA/cm$^2$ | | | | T95 (hour) |
| --- | --- | --- | --- | --- | --- |
| | Volt (V) | Cd/A | CIE$_x$ | CIE$_y$ | |
| Comparative embodiment | 7.4 | 80.1 | 0.316 | 0.323 | 2,836 |
| First embodiment of the present invention | 7.4 | 81.2 | 0.316 | 0.323 | 4,526-7,000 |

The white OLED according to the comparative embodiment has a multi-stack structure including a first stack including a fluorescent blue EML as a first EML and a second stack including a phosphorescent yellow-green EML as a second EML. The phosphorescent yellow-green EML consists of first and second hosts and a phosphorescent yellow-green dopant.

As shown in Table 1 above, the white OLED according to the comparative embodiment has a lifespan of 2,836 hours. By contrast, the white OLED according to the first embodiment of the present invention has a lifespan between 4,526 and 7,000 hours. In Table 1, T95 denotes the time required for the OLED to reach 95% of the total lifespan. For example, the white OLED according to the first embodiment of the present invention has a T95 between 4,526 and 7,000 hours.

While the white OLED according to comparative embodiment has reduced lifespan due to a resistance at an interface between a second EML and a fourth HTL, the white OLED according to the first embodiment of the present invention has decreased interface resistance between the EML2 226 and the adjacent HTL4 224b or ETL2 228 such that the HTL4 224b and the EMA 226a of the adjacent EML2 226 includes a material of the HTL4 224b, and the ETL2 228 and the EMA2 226b of the adjacent EML2 226 includes a material of the ETL2 228. Accordingly, the white OLED has enhanced lifespan.

Figure 5:
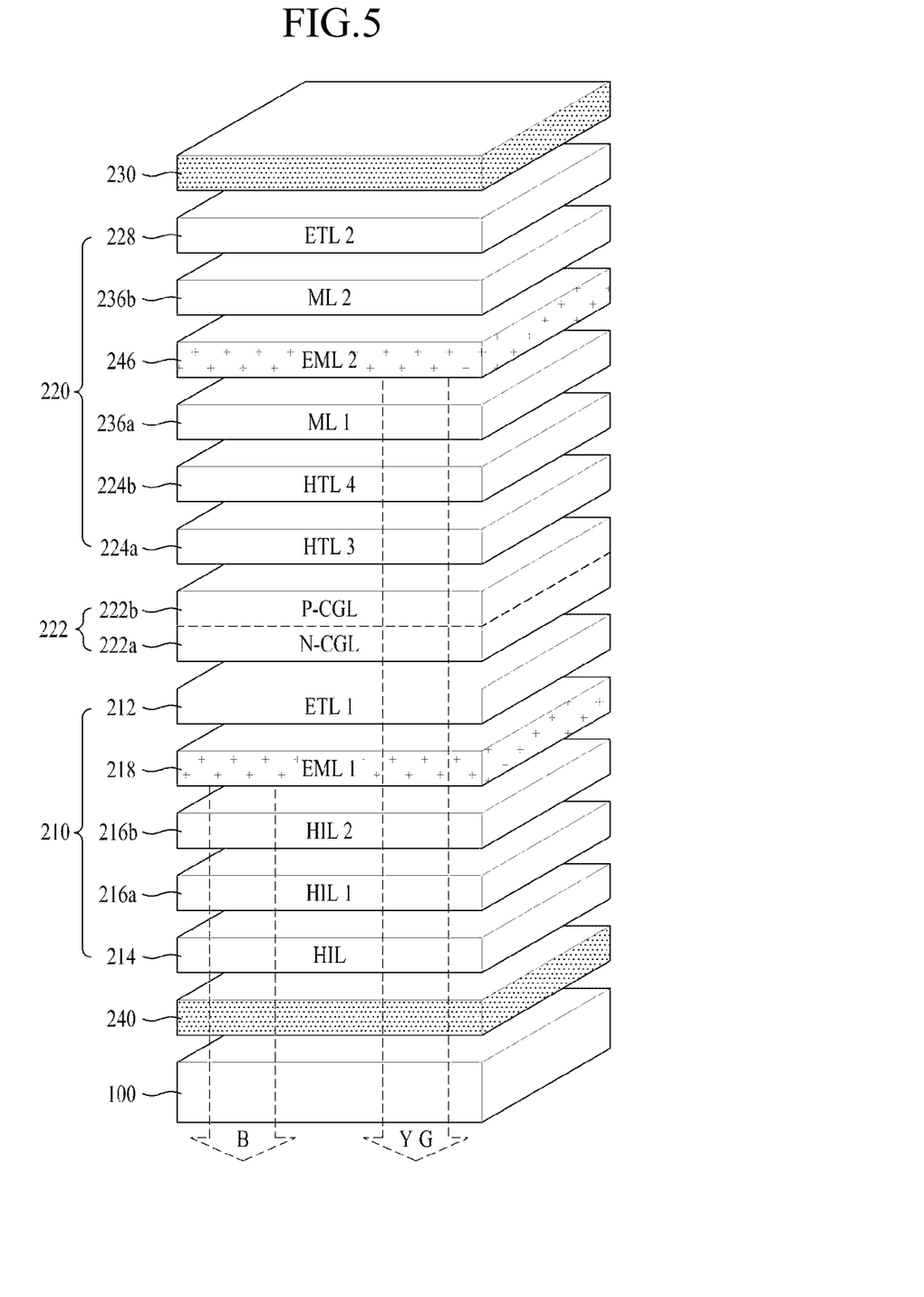
FIG. 5 is a perspective view of a white OLED of an organic light emitting display device according to a second embodiment of the present invention.
Figure 6A:
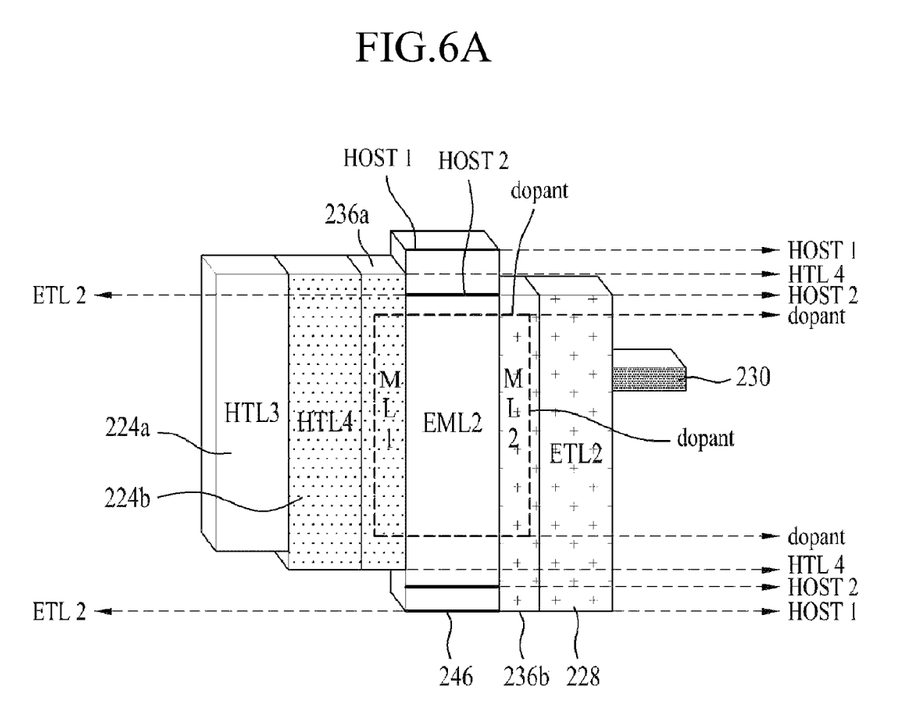
FIG. 6A is a band diagram illustrating the white OLED illustrated in FIG. 5.
Figure 6B:
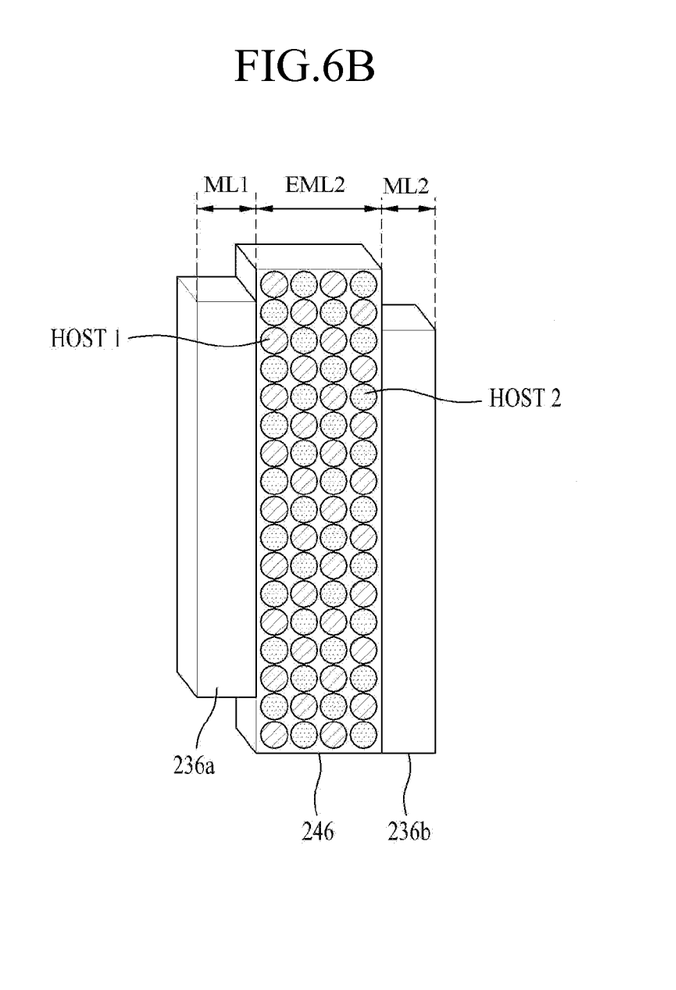
FIG. 6B is a view illustrating first and second hosts formed in a second mixing layer illustrated in FIG. 6A.

FIG. 5 is a perspective view of a white OLED according to a second embodiment of the present invention. FIG. 6A is a band diagram illustrating the white OLED illustrated in FIG. 5. FIG. 6B is a view illustrating first and second hosts formed in a second mixing layer illustrated in FIG. 6A.

The organic light emitting display device according to the second embodiment of the present invention includes a substrate in which a display region is defined by a plurality of sub-pixel regions in the form of a matrix, and an encapsulation substrate or a thin-film encapsulation that is formed on the substrate and protects sub-pixels from moisture or oxygen.

The sub-pixel regions consist of an R sub-pixel region, a G sub-pixel region, a B sub-pixel region, and a W sub-pixel region, and the R, G, B and W sub-pixel regions are arranged in a matrix form and display an image. The R, G, B and W sub-pixel regions may be arranged as illustrated in FIGS. 1A to 1D and disposition order thereof may be changed as desired by a user.

Each of the R, G, B and W sub-pixel regions includes the cell driving unit 200 and a white OLED connected to the cell driving unit 200. The organic light emitting display device according to the second embodiment of the present invention includes the same elements and has the same functions as those of the organic light emitting display device according to the first embodiment of the present invention, except that the organic light emitting display device according to the second embodiment includes a different white OLED, and thus, a detailed description of the same elements will be omitted.

Referring to FIGS. 2 and 5, the white OLED has a multi-stack structure including the first electrode 240 connected to the drain electrode 110 of the driving thin film transistor TD, the second electrode 230 facing the first electrode 240, the bank insulating film 130 provided with bank holes 132 to expose the first electrode 240, and the first stack 210, the CGL 222, and the second stack 220 that are stacked between the first electrode 240 and the second electrode 230. In the white OLED having a multi-stack structure, the respective stacks includes EMLs of different colors, and light emitted from the EMLs of the respective stacks is mixed to realize white light. In addition, FIG. 5 illustrates a bottom emission type white OLED in which light emitted from first and second EMLs (EML1 and EML2) 218 and 246 is emitted in a bottom direction, but embodiments of the present invention are not limited thereto. In another embodiment, the white OLED according to the second embodiment of the present invention may be of a top emission type or a dual emission type.

The first electrode 240 as an anode is formed of a transparent conductive material such as a TCO, e.g., ITO, IZO, or the like.

The second electrode 230 as a cathode is formed of a reflective metal material such as Al, Au, Mo, Cr, Cu, LiF, or an Al—LiF alloy.

The first stack 210 includes the HIL 214, the HTL1 216a, the HTL2 216b, the EML1 218, and the ETL1 212 that are sequentially stacked between the first electrode 240 and the CGL 222. In this regard, the EML1 218 includes a fluorescent blue dopant and host to emit blue light.

The CGL 222 is formed between the first and second stacks 210 and 220 to adjust charge balance therebetween. The CGL 222 includes the N-CGL 222a formed adjacent to the first stack 210 to inject electrons into the first stack 210 and the P-CGL 222b disposed adjacent to the second stack 220 to inject holes into the second stack 220.

The second stack 220 may have a stacked structure in which the HTL3 224a, the HTL4 224b, the EML2 246, and the ETL2 228 are sequentially stacked between the second electrode 230 and the CGL 222 and include a first mixing layer (ML1) 236a between the HTL4 224b and the EML2 228, a second mixing layer (ML2) 236b between the ETL2 228 and the EML2 246, or the ML1 and ML2 236a and 236b. A case in which the white OLED according to the second embodiment of the present invention includes both the ML1 and ML2 236a and 236b will now be described by way of example.

The HTL3 224a transfers holes supplied from the P-CGL 222b to the HTL4 224b, is the thickest element of the white OLED, and adjusts cavity balance. The HTL4 224b transfers holes supplied from the HTL3 224a to the EML2 226 and has a higher triplet energy level T1 than that of the EML2 226 so as to prevent holes injected into the EML2 226 from returning into the HTL4 224b.

The EML2 226 consists of at least two hosts and a single dopant and has at least three emitting areas. Preferably, as illustrated in FIGS. 5A and 5B, the EML2 246 consists of different host materials, i.e., first and second hosts (HOST1 and HOST2) and a phosphorescent yellow-green dopant. In this regard, the HOST1 is formed of a material that more easily receives holes transferred from the ML1 236a including the material of the HTL4 224b than the HOST2, and the HOST2 is formed of a material that more easily receive electrons transferred from the ML2 236b including the material of the ETL2 228 than the HOST1. Accordingly, the EML2 246 satisfactorily receives the holes transferred from the ML1 236a via the HOST1 and satisfactorily receives electrons transferred from the ML2 236b and the ETL2 228 via the HOST2 and thus the electrons and the holes are smoothly recombined therein, which results in enhanced luminous efficiency. The EML2 246 has a thickness of 150 Å to 250 Å.

As illustrated in FIG. 6A, the ML1 236a includes the material of the HTL4 224b and a phosphorescent yellow-green dopant in combination. As such, the ML1 236a includes the material of the HTL4 224b and thus an interface resistance between the EML2 246 and the HTL4 224b is reduced and holes are smoothly injected into the EML2 246. The dopant of the ML1 236a is the same as that of the EML2 246. In this regard, the ML1 236a has a thickness of 30 Å to 100 Å.

As illustrated in FIG. 6A, the ML2 236b includes the material of the ETL2 228 and a phosphorescent yellow-green dopant in combination. As such, the ML2 236b includes the material of the ETL2 228 and thus an interface resistance between the EML2 246 and the ETL2 228 is reduced and electrons are smoothly injected into the EML2 246. The dopant of the ML2 236b is the same as that of the EML2 246. In this regard, the ML2 236b has a thickness of 30 Å to 100 Å.

As such, the charge barrier between the HTL4 224b and the EML2 246 is reduced through the ML1 236a, and the charge barrier between the ETL2 228 and the EML2 246 is reduced through the ML2 236b. As the charge barrier decreases, charge accumulation is reduced and thus the white OLED is not deteriorated, which results in improved lifespan thereof. This will be described with reference to Table 2 below.

Table 2 shows lifespan (in hours) of a white OLED according to a comparative embodiment and lifespan (in hours) of the white OLED according to the second embodiment of the present invention.

TABLE 2

| | 10 mA/cm² | | | | |
| --- | --- | --- | --- | --- | --- |
| Structure | Volt (V) | Cd/A | $CIE_x$ | $CIE_y$ | T95 (hour) |
| Comparative embodiment | 7.4 | 80.1 | 0.316 | 0.323 | 2,836 |
| Case A | 7.4 | 78.7 | 0.316 | 0.313 | 5,436 |
| Case B | 7.4 | 79.8 | 0.317 | 0.317 | 6,742 |

The white OLED according to the comparative embodiment has a multi-stack structure including a first stack including a fluorescent blue EML as a first EML and a second stack including a phosphorescent yellow-green EML as a second EML. The phosphorescent yellow-green EML consists of first and second hosts and a phosphorescent yellow-green dopant.

In Table 2, Case A denotes a case in which the white OLED according to the second embodiment of the present invention includes both the ML1 and ML2 236a and 236b. That is, Case A denotes the white OLED including the first stack 210 including the HIL 214, the HTL1 216a, the HTL2 216b, the EML1 218, and the ETL1 212 that are sequentially stacked, the CGL 222 formed between the first and second stacks 210 and 220, and the second stack 220 including the HTL3 224a, the HTL4 224b, the ML1 236a, the EML2 246, the ML2 236b, and the ETL2 228 that are sequentially stacked on the CGL 222.

In Table 2, Case B denotes a case in which the white OLED according to the second embodiment of the present invention includes only the ML1 236a. That is, Case B denotes the white OLED including the first stack 210 including the HIL 214, the HTL1 216a, the HTL2 216b, the EML1 218, and the ETL1 212 that are sequentially stacked, the CGL 222 formed between the first and second stacks 210 and 220, and the second stack 220 including the HTL3 224a, the HTL4 224b, the ML1 236a, the EML2 246, and the ETL2 228 that are sequentially stacked on the CGL 222.

As shown in Table 2 above, the white OLED according to the comparative embodiment has a lifespan of 2,836 hours. By contrast, the white OLED (Case A) according to the second embodiment of the present invention has a lifespan of 5,436 hours and the white OLED (Case B) according to the second embodiment of the present invention has a lifespan of 6,742 hours.

As such, it can be confirmed that the white OLED according to the second embodiment has a longer lifespan than that of the white OLED according to the comparative embodiment.

While the white OLED according to comparative embodiment has reduced lifespan due to a resistance at an interface between an EML and a fourth HTL, the white OLED according to the second embodiment of the present invention has decreased interface resistance due to the ML1 236a disposed between the HTL4 224b and the EML2 246 and including the material of the HTL4 224b or the ML2 236b disposed between the ETL2 228 and the EML2 246 and including the material of the ETL2 228. Accordingly, the white OLED has enhanced lifespan.

As is apparent from the foregoing description, an organic light emitting display device according to the present invention includes a white OLED including an EML2 consisting of EMA1, EMA2, and EMA3. In the white OLED, a HTL4 and the EMA1 of the adjacent EML2 include a material of the HTL4, and the ETL2 and the EMA2 of the adjacent EML2 include a material of the ETL2, and thus, interface resistance between the EML2 and the adjacent HTL4 or ETL2 is reduced. Accordingly, the white OLED has enhanced lifespan.

In addition, an organic light emitting display device according to the present invention includes a white OLED including at least one of an ML1 and an ML2. The white OLED includes an ML1 disposed between an HTL4 and an EML2 and including a material of the HTL4, an ML2 disposed between an ETL2 and the EML2 and including a material of the ETL2, or the ML1 and ML2 and thus has reduced interface resistance between the EML2 and the adjacent HTL4 or ETL2. Accordingly, the white OLED has enhanced OLED.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An organic light emitting display device comprising:
    first and second electrodes facing each other on a substrate;
    a first stack comprising a hole injection layer, a first hole transport layer, a second hole transport layer, a first emitting layer, and a first electron transport layer that are sequentially stacked on the first electrode;
    a second stack comprising a third hole transport layer, a fourth hole transport layer, a second emitting layer comprising at least two hosts and a single dopant and having at least three emitting areas, and a second electron transport layer that are sequentially stacked between the first stack and the second electrode; and
    a charge generation layer formed between the first stack and the second stack and adjusting charge balance between the first and second stacks,
    wherein the second emitting layer comprises a first emitting area comprising a material of the fourth hole transport layer, a second emitting area comprising a material of the second electron transport layer, and a third emitting area comprising the at least two hosts.

2. The organic light emitting display device according to claim 1, wherein the third emitting area comprises first and second hosts and a phosphorescent dopant.

3. The organic light emitting display device according to claim 2, wherein the first emitting area comprises the first host and the phosphorescent dopant, the phosphorescent dopant being the same as that of the third emitting area.

4. The organic light emitting display device according to claim 2, wherein the second emitting area comprises the second host and the phosphorescent dopant, the phosphorescent dopant being the same as that of the third emitting area.

5. The organic light emitting display device according to claim 2, wherein the first host comprises a material that more receives holes transferred from the fourth hole transport layer than the second host.

6. The organic light emitting display device according to claim 2, wherein the second host comprises a material that more receives electrons transferred from the second electron transport layer than the first host.

7. The organic light emitting display device according to claim 1, wherein the first emitting area has a thickness of 30 Å to 100 Å, and the second emitting area has a thickness of 30 Å to 100 Å.

8. The organic light emitting display device according to claim 1, wherein the second emitting layer has a thickness of 150 Å to 250 Å.

9. An organic light emitting display device comprising:
    first and second electrodes facing each other on a substrate;
    a first stack comprising a hole injection layer, a first hole transport layer, a second hole transport layer, a first emitting layer, and a first electron transport layer that are sequentially stacked on the first electrode;
    a second stack comprising a third hole transport layer, a fourth hole transport layer, a second emitting layer comprising at least two hosts and a dopant, and a second electron transport layer that are sequentially stacked between the first stack and the second electrode;
    a charge generation layer formed between the first stack and the second stack and adjusting charge balance between the first and second stacks; and
    at least one of a first mixing layer disposed between the fourth hole transport layer and the second emitting layer and a second mixing layer disposed between the second electron transport layer and the second emitting layer, wherein the first mixing layer comprises a material of the fourth hole transport layer and the dopant, and the second mixing layer comprises a material of the second electron transport layer and the dopant.

10. The organic light emitting display device according to claim 9, wherein the second emitting layer comprises first and second hosts and a phosphorescent dopant.

11. The organic light emitting display device according to claim 10, wherein the first host comprises a material that more receives holes transferred from the first mixing layer comprising the material of the fourth hole transport layer than the second host.

12. The organic light emitting display device according to claim 10, wherein the second host comprises a material that more receives electrons transferred from the second mixing layer comprising the material of the second electron transport layer than the first host.

13. The organic light emitting display device according to claim 9, wherein the dopant of the first and second mixing layers is the same as that of the second emitting layer.

14. The organic light emitting display device according to claim 9, wherein the first mixing layer has a thickness of 30 Å to 100 Å, and the second mixing layer has a thickness of 30 Å to 100 Å.

15. The organic light emitting display device according to claim 9, wherein the second emitting layer has a thickness of 150 Å to 250 Å.

* * * * *